US012592679B2

(12) United States Patent
Mori et al.

(10) Patent No.: US 12,592,679 B2
(45) Date of Patent: Mar. 31, 2026

(54) MULTIPLEXER, RADIO-FREQUENCY MODULE, AND COMMUNICATION APPARATUS

(71) Applicant: Murata Manufacturing Co., Ltd., Nagaokakyo (JP)

(72) Inventors: Hirotsugu Mori, Nagaokakyo (JP); Syunsuke Kido, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 459 days.

(21) Appl. No.: 18/305,397

(22) Filed: Apr. 24, 2023

(65) Prior Publication Data

US 2023/0261642 A1     Aug. 17, 2023

Related U.S. Application Data

(63) Continuation of application No. PCT/JP2021/036990, filed on Oct. 6, 2021.

(30) Foreign Application Priority Data

Nov. 2, 2020     (JP) ................................. 2020-183515

(51) Int. Cl.
| | |
|---|---|
| *H03H 9/70* | (2006.01) |
| *H03H 9/56* | (2006.01) |
| *H04B 1/00* | (2006.01) |

(52) U.S. Cl.
CPC ............ *H03H 9/703* (2013.01); *H03H 9/568* (2013.01); *H04B 1/0057* (2013.01)

(58) Field of Classification Search
CPC ...... H03H 9/725; H03H 9/6483; H03H 9/706; H03H 9/542; H03H 9/605; H03H 9/25;
(Continued)

(56) References Cited

U.S. PATENT DOCUMENTS

| | | | | |
|---|---|---|---|---|
| 2015/0295697 A1* | 10/2015 | Kawachi | ................ | H04B 1/50 |
| | | | | 370/276 |
| 2016/0127015 A1 | 5/2016 | Wloczysiak et al. | | |

(Continued)

FOREIGN PATENT DOCUMENTS

| | | |
|---|---|---|
| JP | 2008-22408 A | 1/2008 |
| JP | 2008-085989 A | 4/2008 |
| JP | 2019-154031 A | 9/2019 |
| JP | 2020-167445 A | 10/2020 |
| WO | 2019/131501 A1 | 7/2019 |

OTHER PUBLICATIONS

International Search Report and Written Opinion mailed on Nov. 16, 2021, received for PCT Application PCT/JP2021/036990, filed on Oct. 6, 2021, 9 pages including English Translation.
(Continued)

*Primary Examiner* — Lincoln D Donovan
*Assistant Examiner* — Tyler J Pereny
(74) *Attorney, Agent, or Firm* — XSENSUS LLP

(57) ABSTRACT

A multiplexer includes first and second filters connected to an antenna connecting terminal. The first filter includes a first series arm resonator and a first parallel arm resonator. Each of the first series arm resonator and the first parallel arm resonator includes a bottom electrode, a top electrode, and a piezoelectric layer. At least one of resonators forming the first series arm resonator and the first parallel arm resonator is constituted by plural series-divided resonators. The second filter includes plural second series arm resonators and a second parallel arm resonator. Each of the plural second series arm resonators and the second parallel arm resonator includes a bottom electrode, a top electrode, and a piezoelectric layer. Among the plural second series arm resonators, the top electrodes or the bottom electrodes of two adjacent second series arm resonators are formed by one electrode.

18 Claims, 7 Drawing Sheets

(58) Field of Classification Search
CPC ............ H03H 9/70; H03H 9/72; H03H 9/568;
H03H 9/6403; H03H 1/00; H03H 7/0115;
H03H 7/075; H03H 9/02574; H03H
9/0557; H03H 9/0566; H03H 9/703;
H04B 1/40; H04B 1/0057; H04B 1/006;
H04B 1/00; H04B 1/18; H04B 1/0067;
H04B 1/0458; H04B 1/44; H04B 1/48;
H04B 1/50; H04B 1/52; H04B 1/525;
H03F 2200/451; H03F 2200/165; H03F
2200/171; H03F 3/68; H03F 3/195; H03F
3/245; H03F 2200/111; H03F 2200/294;
H03F 2203/7209
See application file for complete search history.

(56) References Cited

U.S. PATENT DOCUMENTS

| | | | | |
|---|---|---|---|---|
| 2018/0006631 | A1 * | 1/2018 | Kida | H03H 9/205 |
| 2018/0159508 | A1 * | 6/2018 | Irieda | H03H 9/587 |
| 2019/0386641 | A1 | 12/2019 | Lee et al. | |

OTHER PUBLICATIONS

"A New Generation of 5G Filter Technology", Qorvo, Jan. 2020, pp. 1-6.
Chinese Notification of the First Office Action issued Sep. 12, 2023, in corresponding Chinese Application No. 202190000829.5, 4pp.

\* cited by examiner

Db<Ds

MULTIPLEXER, RADIO-FREQUENCY MODULE, AND COMMUNICATION APPARATUS

CROSS-REFERENCE TO RELATED APPLICATIONS

This application is a continuation application of PCT International Application No. PCT/JP2021/036990 filed on Oct. 6, 2021, designating the United States of America, which is based on and claims priority to Japanese Patent Application No. 2020-183515 filed on Nov. 2, 2020. The entire disclosures of the above-identified applications, including the specifications, drawings, and claims are incorporated herein by reference in their entirety.

BACKGROUND

1. Field of the Disclosure

The present disclosure relates to a multiplexer, a radio-frequency module, and a communication apparatus.

2. Description of the Related Art

It is desirable that a multiband- and multimode-support radio-frequency circuit send and receive multiple radio-frequency signals with a small loss and a high isolation.

U.S. Patent Application Publication No. 2016/0127015 discloses a receiver module (multiplexer) in which multiple filters whose pass bands are different from each other are connected to an antenna via a switch.

SUMMARY

The recent versions of 3GPP (Third Generation Partnership Project) specify simultaneous transmission of radio-frequency signals of multiple bands including 5G (5th generation)-NR (New Radio) bands. Combinations of bands to be simultaneously transmitted thus become diversified. It is anticipated that there will be more cases in which signal distortion occurs depending on the frequency to be used and the quality of a sending signal or a received signal is degraded. Examples of major modes of signal distortion that degrade the quality of a sending signal or a received signal are the second-, third-, and fourth-order distortion modes. It is thus desirable to reduce the occurrence of unwanted waves of multiple major distortion modes (second-, third-, and fourth-order distortion modes) rather than to reduce unwanted waves of a single specific distortion mode to suppress the degradation of the quality of a sending signal or a received signal.

It is an aspect of the present disclosure to provide a multiplexer, a radio-frequency module, and a communication apparatus that are capable of reducing the occurrence of unwanted waves of multiple major distortion modes.

According to an aspect of the disclosure, there is provided a multiplexer including first and second filters. The first filter is connected to a common terminal and has a first pass band including a first band which is sized to pass a signal. The second filter is connected to the common terminal and has a second pass band including a second band which is sized to pass another signal. The first filter includes a first series arm resonator and a first parallel arm resonator. The first series arm resonator is disposed on a first series arm path which connects the common terminal and a first radio-frequency input terminal that receives a first sending signal of the first band. The first parallel arm resonator is disposed on a first parallel arm path which connects the first series arm path and a ground. Each of the first series arm resonator and the first parallel arm resonator includes a first support substrate, a first bottom electrode disposed above the first support substrate, a first top electrode disposed above the first bottom electrode, and a first piezoelectric layer disposed between the first bottom electrode and the first top electrode. At least one of resonators forming the first series arm resonator and the first parallel arm resonator is constituted by plural series-divided resonators connected in series with each other. The second filter includes plural second series arm resonators and a second parallel arm resonator. The plural second series arm resonators are disposed on a second series arm path which connects the common terminal and a second radio-frequency input terminal that receives a second sending signal of the second band. The second parallel arm resonator is disposed on a second parallel arm path which connects the second series arm path and a ground. Each of the plural second series arm resonators and the second parallel arm resonator includes a second support substrate, a second bottom electrode disposed above the second support substrate, a second top electrode disposed above the second bottom electrode, and a second piezoelectric layer disposed between the second bottom electrode and the second top electrode. Regarding two adjacent second series arm resonators of the plural second series arm resonators, the second top electrode or the second bottom electrode of one second series arm resonator and the second top electrode or the second bottom electrode of the other second series arm resonator are formed by one electrode.

According to an aspect of the disclosure, there is provided a multiplexer including first and second filters. The first filter is connected to a common terminal and has a first pass band including a first band which is sized to pass a signal. The second filter is connected to the common terminal and has a second pass band including a second band which is sized to pass another signal. The first filter includes a first series arm resonator and a first parallel arm resonator. The first series arm resonator is disposed on a first series arm path which connects the common terminal and a first radio-frequency input terminal that receives a first sending signal of the first band. The first parallel arm resonator is disposed on a first parallel arm path which connects the first series arm path and a ground. Each of the first series arm resonator and the first parallel arm resonator includes a first support substrate, a first bottom electrode disposed above the first support substrate, a first top electrode disposed above the first bottom electrode, and a first piezoelectric layer disposed between the first bottom electrode and the first top electrode. At least one of resonators forming the first series arm resonator and the first parallel arm resonator is constituted by plural series-divided resonators connected in series with each other. The second filter includes a second series arm resonator and plural second parallel arm resonators. The second series arm resonator is disposed on a second series arm path which connects the common terminal and a second radio-frequency input terminal that receives a second sending signal of the second band. The plural second parallel arm resonators are disposed on individual second parallel arm paths, each of which connects the second series arm path and a ground. Each of the second series arm resonator and the plural second parallel arm resonators includes a second support substrate, a second bottom electrode disposed above the second support substrate, a second top electrode disposed above the second bottom electrode, and a second piezoelectric layer disposed between the second bottom electrode and the second top electrode. Regarding two second parallel arm resonators of the plural second parallel arm resonators, one second parallel arm resonator being directly connected to one end of the second series arm resonator, the other second parallel arm resonator being directly connected to the other end of the second series arm resonator, the second top electrodes or the second bottom electrodes of the two second parallel arm resonators are formed by one electrode.

According to an aspect of the disclosure, there is provided a multiplexer including first and second filters. The first filter is connected to a common terminal and has a first pass band including a first band sized to send a signal. The second filter is connected to the common terminal and has a second pass band including a second band which is sized to pass another signal. The first filter includes a first series arm resonator and a first parallel arm resonator. The first series arm resonator is disposed on a first series arm path which connects the common terminal and a first radio-frequency input terminal that receives a first sending signal of the first band. The first parallel arm resonator is disposed on a first parallel arm path which connects the first series arm path and a ground. Each of the first series arm resonator and the first parallel arm resonator includes a first support substrate, a first bottom electrode disposed above the first support substrate, a first top electrode disposed above the first bottom electrode, and a first piezoelectric layer disposed between the first bottom electrode and the first top electrode. At least one of resonators forming the first series arm resonator and the first parallel arm resonator is constituted by plural series-divided resonators connected in series with each other. The second filter includes a second series arm resonator and a second parallel arm resonator. The second series arm resonator is disposed on a second series arm path which connects the common terminal and a second radio-frequency input terminal that receives a second sending signal of the second band. The second parallel arm resonator is disposed on a second parallel arm path which connects the second series arm path and a ground. At least one of resonators forming the second series arm resonator and the second parallel arm resonator is constituted by plural parallel-divided resonators connected in parallel with each other. Each of the plural parallel-divided resonators includes a second support substrate, a second bottom electrode disposed above the second support substrate, a second top electrode disposed above the second bottom electrode, and a second piezoelectric layer disposed between the second bottom electrode and the second top electrode. The second top electrode of one of the plural parallel-divided resonators and the second bottom electrode of another one of the plural parallel-divided resonators are connected to each other.

According to aspects of the disclosure, it is possible to provide a multiplexer, a radio-frequency module, and a communication apparatus that are capable of reducing the occurrence of unwanted (sometimes referred to as "a predetermined wave") waves of multiple major distortion modes.

BRIEF DESCRIPTION OF THE DRAWINGS

FIG. 4(a) is a circuit diagram of a second filter according to the first embodiment, and subpart FIG. 4(b) illustrates the multilayer structure of adjacent series arm resonators;

FIG. 5(a) is a circuit diagram of the second filter according to a modified example of the first embodiment, and subpart FIG. 5(b) illustrates the multilayer structure of parallel-divided resonators;

DESCRIPTION OF THE EMBODIMENTS

Figure 1:
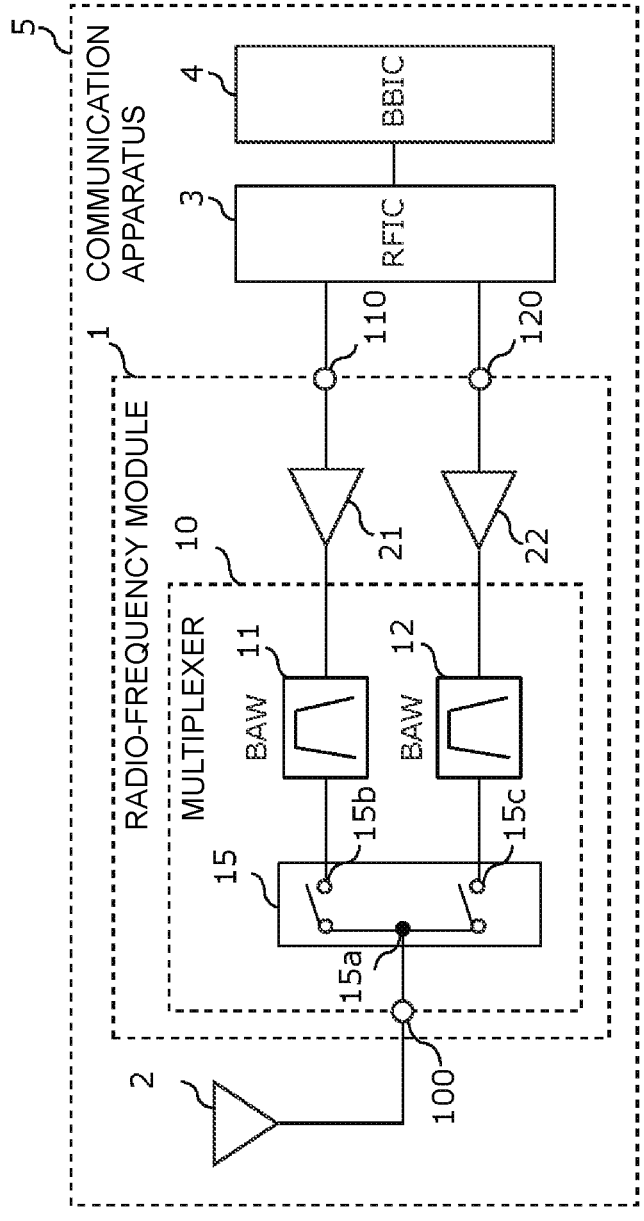
FIG. 1 is a circuit block diagram of a multiplexer, a radio-frequency module, and a communication apparatus according to a first embodiment.

Embodiments of the disclosure will be described below in detail with reference to the accompanying drawings. Embodiments described below illustrate general or specific examples. Numerical values, configurations, materials, components, and positions and connection states of the components illustrated in the following embodiments are only examples and are not intended to limit the invention.

The drawings are only schematically shown and are not necessarily precisely illustrated. For the sake of representation, the drawings are illustrated in an exaggerated manner or with omissions or the ratios of components in the drawings are adjusted. The configurations, positional relationships, and ratios of components in the drawings may be different from those of the actual components. In the drawings, substantially identical components are designated by like reference numeral, and it may be possible that an explanation of such components be not repeated or be merely simplified.

In the disclosure, "A is connected to B" includes, not only the meaning that A is directly connected to B using a connecting terminal and/or a wiring conductor, but also the meaning that A is electrically connected to B via another circuit element. "Being connected between A and B" means that "being connected to both A and B on a path which connects A and B".

First Embodiment

[1.1 Circuit Configurations of Multiplexer 10, Radio-Frequency Module 1, and Communication Apparatus 5]

FIG. 1 is a circuit block diagram of a multiplexer 10, a radio-frequency module 1, and a communication apparatus 5 according to a first embodiment. As illustrated in FIG. 1, the communication apparatus 5 includes the radio-frequency module 1, an antenna 2, a radio-frequency (RF) signal processing circuit 3, and a baseband signal processing circuit 4. Hereinafter, the radio-frequency (RF) signal processing circuit 3 will be called a radio-frequency integrated circuit (RFIC) 3, and the baseband signal processing circuit 4 will be called a baseband integrated circuit (BBIC) 4. The radio-frequency module 1 transmits a radio-frequency signal between the antenna 2 and the RFIC 3. The detailed circuit configuration of the radio-frequency module 1 will be discussed later.

The antenna 2 is connected to an antenna connecting terminal 100 of the radio-frequency module 1. The antenna 2 sends a radio-frequency signal output from the radio-frequency module 1 and also receives a radio-frequency signal from an external source and outputs it to the radio-frequency module 1.

The RFIC 3 is an example of a signal processing circuit that processes a radio-frequency signal. The RFIC 3 will be discussed below more specifically. The RFIC 3 performs signal processing, such as down-conversion, on a radio-frequency received signal which is received via a receive path of the radio-frequency module 1 and outputs the resulting received signal to the BBIC 4. The RFIC 3 also performs signal processing, such as up-conversion, on a sending signal received from the BBIC 4 and outputs the resulting radio-frequency sending signal to a sending path of the radio-frequency module 1. The RFIC 3 includes a controller that controls components, such as a switch and amplifiers, of the radio-frequency module 1. All or some of the functions of the RFIC 3 as the controller may be installed in a source outside the RFIC 3, such as in the BBIC 4 or the radio-frequency module 1.

The BBIC 4 is a baseband signal processing circuit that performs signal processing by using an intermediate-frequency (IF) band, which is lower than a radio-frequency signal transmitted by the radio-frequency module 1. Examples of signals to be processed by the BBIC 4 are image signals for displaying images and/or audio signals for performing communication via a speaker.

The antenna 2 and the BBIC 4 are not essential components for the communication apparatus 5 of the first embodiment.

The detailed circuit configuration of the radio-frequency module 1 will now be discussed below. As illustrated in FIG. 1, the radio-frequency module 1 includes the multiplexer 10, power amplifiers 21 and 22, and radio-frequency input terminals 110 and 120.

The radio-frequency input terminals 110 and 120 are terminals for receiving a radio-frequency sending signal from the outside of the radio-frequency module 1.

The multiplexer 10 is disposed between the antenna 2 and the RFIC 3. The multiplexer 10 separates received signals input from the antenna 2 from each other and combines sending signals input from the RFIC 3. The multiplexer 10 includes filters 11 and 12, a switch 15, and the antenna connecting terminal 100.

The antenna connecting terminal 100 is an example of a common terminal and is connected to the antenna 2 and to the switch 15.

The filter 11 is an example of a first filter. The filter 11 is connected to the antenna connecting terminal 100 via the switch 15 and has a first pass band including a first band which can be used for sending a signal.

The filter 12 is an example of a second filter. The filter 12 is connected to the antenna connecting terminal 100 via the switch 15 and has a second pass band including a second band which can be used for sending a signal.

The first band and the second band each refer to a frequency band defined by a standardizing body (such as 3GPP and Institute of Electrical and Electronics Engineers (IEEE)) for a communication system to be constructed using a radio access technology (RAT). In the first embodiment, as the communication system, a long term evolution (LTE) system, a 5G-NR system, and a wireless local area network (WLAN) system, for example, may be used. However, the communication system is not limited to these types of systems.

The switch 15 has two single pole single throw (SPST) switch elements. A terminal 15*a* is connected to the antenna connecting terminal 100. A terminal 15*b* is connected to the filter 11, while a terminal 15*c* is connected to the filter 12. With this configuration, based on a control signal from the RFIC 3, for example, the switch 15 selectively connects or disconnects the antenna connecting terminal 100 to or from the filter 11 and selectively connects or disconnects the antenna connecting terminal 100 to or from the filter 12. The number of switch elements of the switch 15 is suitably set in accordance with the number of filters of the multiplexer 10.

The power amplifier 21 is an example of a first power amplifier. The power amplifier 21 is connected between the filter 11 and the radio-frequency input terminal 110 and is able to amplify a sending signal of the first band input from the radio-frequency input terminal 110.

The power amplifier 22 is an example of a second power amplifier. The power amplifier 22 is connected between the filter 12 and the radio-frequency input terminal 120 and is able to amplify a sending signal of the second band input from the radio-frequency input terminal 120.

In the multiplexer 10, the provision of the switch 15 may be omitted. In this case, the filters 11 and 12 may be directly connected to the antenna connecting terminal 100.

An impedance matching circuit may be inserted between the filter 11 and the power amplifier 21 and/or between the filter 12 and the power amplifier 22. An impedance matching circuit may be inserted between the antenna connecting terminal 100 and the filter 11 and/or between the antenna connecting terminal 100 and the filter 12.

[1.2 Structure of BAW Resonator]

The structure of acoustic wave resonators forming the filters 11 and 12 will be discussed below.

Each of the filters 11 and 12 is an example of a bulk acoustic wave (BAW) filter and includes one or more BAW resonators.

Figure 2A:
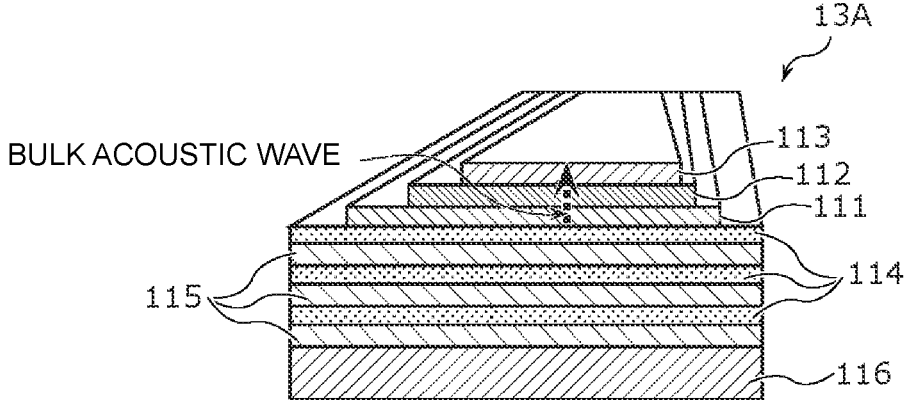
FIG. 2A is a schematic perspective view illustrating a first example of the structure of a filter according to the first embodiment.

FIG. 2A is a schematic perspective view illustrating a first example (filter 13A) of the structure of the filter 11 or 12 of the first embodiment. In FIG. 2A, one of one or more BAW resonators forming the filter 13A is shown. Each of one or more BAW resonators forming the filter 13A is a solidly mounted resonator (SMR). As illustrated in FIG. 2A, the BAW resonator, which is an SMR (hereinafter called the SMR BAW resonator), includes a silicon (Si) substrate 116, a bottom electrode 111, a top electrode 113, a piezoelectric layer 112, low acoustic impedance films 114, and high acoustic impedance films 115, for example. The Si substrate 116 is an example of a support substrate. An acoustic multilayer film constituted by the low acoustic impedance films 114 and the high acoustic impedance films 115 alternately stacked on each other is disposed above the Si substrate 116. The bottom electrode 111 is disposed above the acoustic multilayer film. The top electrode 113 is disposed above the bottom electrode 111. The piezoelectric layer 112 is disposed between the bottom electrode 111 and the top electrode 113. With this structure, by utilizing Bragg reflection of the acoustic multilayer film disposed between the Si substrate 116 and a set of the bottom electrode 111, the top electrode 113, and the piezoelectric layer 112, the SMR BAW resonator traps BAWs above the acoustic multilayer film.

With the above-described configuration, when a radio-frequency signal is input between the bottom electrode 111 and the top electrode 113, a potential difference is generated between the bottom electrode 111 and the top electrode 113. This causes the piezoelectric layer 112 to distort so as to generate a BAW in the stacking direction of the bottom electrode 111, the piezoelectric layer 112, and the top electrode 113. The film thickness of the piezoelectric layer 112 and the wavelength of the pass band of the filter 13A are preset to correspond to each other. This allows a radio-frequency signal only having target frequency components to pass through the filter 13A.

Figure 2B:
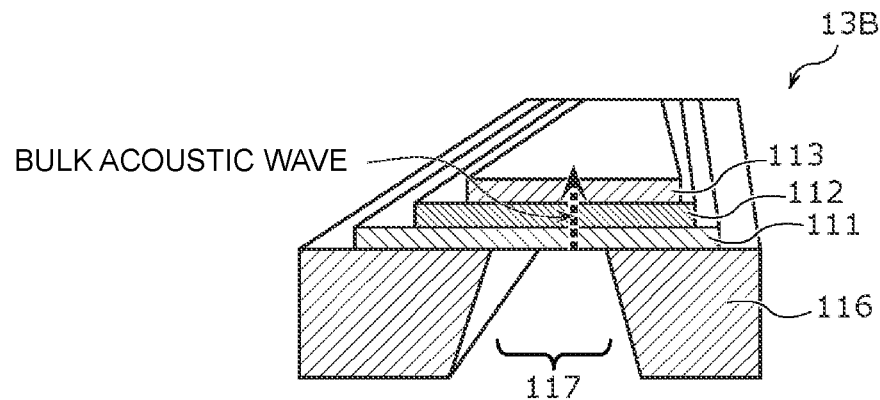
FIG. 2B is a schematic perspective view illustrating a second example of the structure of a filter according to the first embodiment.

FIG. 2B is a schematic perspective view illustrating a second example (filter 13B) of the structure of the filter 11 or 12 of the first embodiment. In FIG. 2B, one of one or more BAW resonators forming the filter 13B is shown. Each of one or more BAW resonators forming the filter 13B is a film bulk acoustic resonator (FBAR). As illustrated in FIG. 2B, the BAW resonator, which is an FBAR (hereinafter called the FBAR BAW resonator), includes a Si substrate 116, a bottom electrode 111, a top electrode 113, and a piezoelectric layer 112, for example. The Si substrate 116 is an example of the support substrate. The bottom electrode 111 is disposed above the Si substrate 116. The top electrode 113 is disposed above the bottom electrode 111. The piezoelectric layer 112 is disposed between the bottom electrode 111 and the top electrode 113. The filter 13B also has a cavity 117 formed in the Si substrate 116. With this structure, a BAW to be excited between the bottom electrode 111 and the top electrode 113 is generated in the stacking direction of the bottom electrode 111, the piezoelectric layer 112, and the top electrode 113.

With the above-described configuration, when a radio-frequency signal is input between the bottom electrode 111 and the top electrode 113, a potential difference is generated between the bottom electrode 111 and the top electrode 113. This causes the piezoelectric layer 112 to distort so as to generate a BAW in the stacking direction of the bottom electrode 111, the piezoelectric layer 112, and the top electrode 113. The film thickness of the piezoelectric layer 112 and the wavelength of the pass band of the filter 13B are preset to correspond to each other. This allows a radio-frequency signal only having target frequency components to pass through the filter 13B.

[1.3 Structures of Filters 11 and 12]

If the first pass band of the filter 11 is positioned at a lower frequency side than the second pass band of the filter 12, the acoustic wave resonator of the filter 11 may desirably be an FBAR, while the acoustic wave resonator of the filter 12 may desirably be an SMR.

The level of unwanted waves of higher-order modes that occur in the FBAR is lower than that in the SMR. Forming the filter 11 having a pass band on the lower frequency side by using the FBAR can thus reduce unwanted waves of higher-order modes that may occur in the pass band of the filter 12 on the higher frequency side. The filter 11 can allow the piezoelectric layer 112 of the FBAR to freely vibrate because of the provision of the cavity 117, thereby enhancing the resonance Q factor and reducing the insertion loss. It is thus possible to reduce the insertion loss of the filters 11 and 12, thereby implementing the small-loss multiplexer 10.

There may be a case in which, depending on the band to be used, it is desirable to improve the communication performance of the communication apparatus 5 by using a high power mode, which can increase transmit power. The high power mode is a mode in which communication is performed by using, for example, Power Class 3 (maximum output power is +23 dBm) or Power Class 2, whose output power is higher than Power Class 3. When the radio-frequency module 1 is operated in the high power mode, heat generation in the radio-frequency module 1 is increased. It is thus desirable to enhance heat dissipation of circuit components mounted on the radio-frequency module 1.

The filters 11 and 12 forming the multiplexer 10 of the first embodiment are constituted by BAW resonators having higher heat dissipation characteristics than surface acoustic wave (SAW) resonators. The multiplexer 10 can thus improve the heat dissipation characteristics.

Additionally, in the SMR, a heat dissipation path via the Si substrate 116 is formed because of the presence of the acoustic multilayer film. The SMR thus exhibits higher heat dissipation characteristics than the FBAR.

From this point of view, a filter for allowing a sending signal of the high power mode to pass therethrough is desirably constituted by the SMR. Examples of the band using the high power mode are n41, n77, n78, and n79 for 5G-NR.

The filters 11 and 12 may be formed using the same chip or the same package. To put it more specifically, "filters 11 and 12 being formed using the same chip" means that the filters 11 and 12 are formed on the single continuous Si substrate 116 or use the single continuous piezoelectric layer 112.

The circuit configurations of the filters 11 and 12 will now be explained below.

Figure 3:
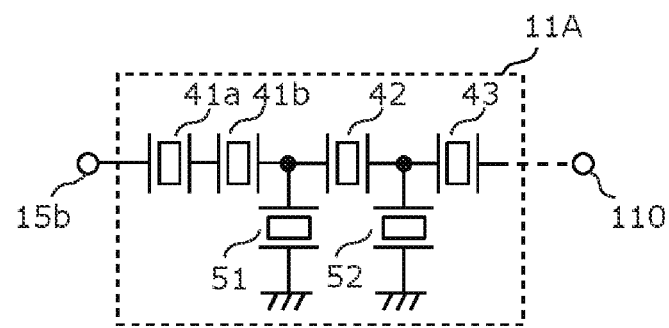
FIG. 3 is a circuit diagram illustrating the structure of a first filter according to the first embodiment.

FIG. 3 is a circuit diagram illustrating the structure of a filter 11A according to the first embodiment. The filter 11A, which is an example of the first filter, includes series-divided resonators 41*a* and 41*b*, series arm resonators 42 and 43, and parallel arm resonators 51 and 52.

Each of the series-divided resonators 41*a* and 41*b* and the series arm resonators 42 and 43 is an example of a first series arm resonator and is disposed on a first series arm path connecting the terminal 15*b* and the radio-frequency input terminal 110. Each of the parallel arm resonators 51 and 52 is an example of a first parallel arm resonator and the parallel arm resonators 51 and 52 are disposed on individual first parallel arm paths each connecting the first series arm path and a ground. The series-divided resonators 41*a* and 41*b* are resonators obtained by dividing one series arm resonator in series. No circuit element is connected to a node of each of the series-divided resonators 41*a* and 41*b*.

The series-divided resonators 41*a* and 41*b*, the series arm resonators 42 and 43, and the parallel arm resonators 51 and 52 forming the filter 11A are all FBARs or all SMRS. Each of the series-divided resonators 41*a* and 41*b*, the series arm resonators 42 and 43, and the parallel arm resonators 51 and 52 includes a Si substrate 116 (first support substrate), a bottom electrode 111 (first bottom electrode) disposed above the Si substrate 116, a top electrode 113 (first top electrode) disposed above the bottom electrode 111, and a piezoelectric layer 112 (first piezoelectric layer) disposed between the bottom electrode 111 and the top electrode 113.

The filter 11A constituted by BAW resonators is capable of reducing the occurrence of unwanted waves of the third-order distortion mode. While power is concentrated on the electrode fingers of comb-shaped electrodes of a SAW resonator, power is distributed over the entirety of the piezoelectric layer of a BAW resonator, which makes it difficult to cause nonlinear distortion. A BAW resonator is thus capable of reducing unwanted waves of the odd-order distortion modes rather than those of the even-order distortion modes. In the filter 11A, since one of the series arm resonators is constituted by the series-divided resonators 41a and 41b, the electrode area of each of the series-divided resonators 41a and 41b is four times as large as that of the other series arm resonators. This can reduce the power density of the series-divided resonators 41a and 41b. A radio-frequency signal to be output from the filter 11A toward the terminal 15b is thus less likely to become nonlinear, thereby making it possible to effectively reduce a leakage of unwanted waves of the third-order distortion mode from the filter 11A.

In the filter 11A, instead of forming one series arm resonator by the series-divided resonators 41a and 41b, one parallel arm resonator may be formed by two series-divided resonators.

In this case, in the filter 11A, since one parallel arm resonator is constituted by two series-divided resonators, the electrode area of each of the series-divided resonators is four times as large as that of the other parallel arm resonators. This can reduce the power density of the series-divided resonators. A radio-frequency signal to be output from the filter 11A toward the terminal 15b is thus less likely to become nonlinear, thereby making it possible to effectively reduce a leakage of unwanted waves of the third-order distortion mode from the filter 11A.

The series-divided resonators 41a and 41b are connected to the terminal 15b at positions closer to the terminal 15b than the series arm resonators 42 and 43 and the parallel arm resonators 51 and 52.

This can reduce the power density of a resonator connected at the closest position to the terminal 15b. A radio-frequency signal to be output from the filter 11A toward the terminal 15b is thus less likely to become nonlinear, thereby making it possible to effectively reduce a leakage of unwanted waves of distortion modes from the filter 11A.

Figure 4:
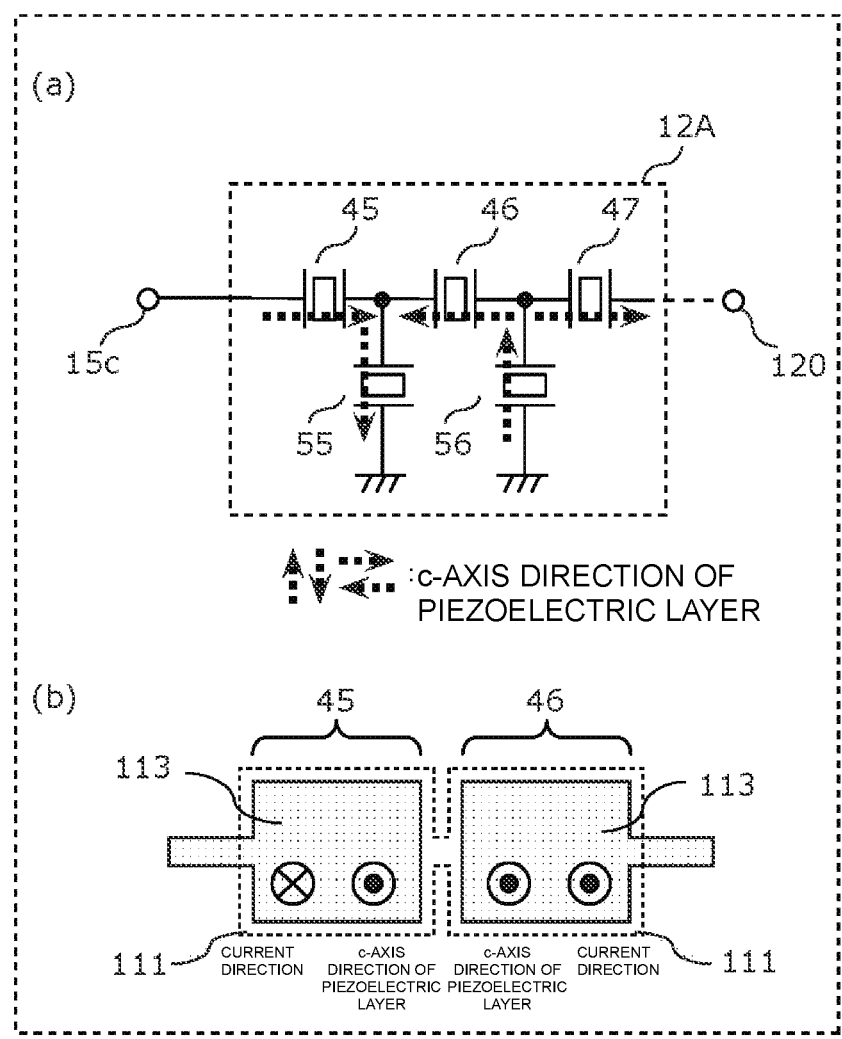
FIG. 4 includes two subparts: subpart

Subpart FIG. 4(a) of FIG. 4 is a circuit diagram of a filter 12A according to the first embodiment. Subpart FIG. 4(b) of FIG. 4 illustrates the multilayer structure of series arm resonators 45 and 46 adjacent to each other. The filter 12A is an example of the second filter and includes series arm resonators 45, 46, and 47 and parallel arm resonators 55 and 56.

Each of the series arm resonators 45 through 47 is an example of a second series arm resonator and is disposed on a second series arm path connecting the terminal 15c and the radio-frequency input terminal 120. Each of the parallel arm resonators 55 and 56 is an example of a second parallel arm resonator and the parallel arm resonators 55 and 56 are disposed on individual second parallel arm paths connecting the second series arm path and a ground.

The series arm resonators 45 through 47 and the parallel arm resonators 55 and 56 forming the filter 12A are all FBARs or all SMRs. Each of the series arm resonators 45 through 47 and the parallel arm resonators 55 and 56 includes a Si substrate 116 (second support substrate), a bottom electrode 111 (second bottom electrode) disposed above the Si substrate 116, a top electrode 113 (second top electrode) disposed above the bottom electrode 111, and a piezoelectric layer 112 (second piezoelectric layer) disposed between the bottom electrode 111 and the top electrode 113.

As illustrated in subpart FIG. 4(b) of FIG. 4, the bottom electrodes 111 of the series arm resonators 45 and 46 which are directly connected to each other on the second series arm path are directly connected to each other. In other words, the bottom electrodes 111 of the series arm resonators 45 and 46 directly connected to each other on the second series arm path are formed by one electrode. With this configuration, the crystal forming the piezoelectric layer 112 formed between the bottom electrode 111 and the top electrode 113 is oriented on the bottom electrode 111 along the c axis (direction from the bottom electrode 111 to the top electrode 113), for example. In the filter 12A, for example, a radio-frequency signal in the series arm resonator 45 flows in a direction from the top electrode 113 to the bottom electrode 111, while a radio-frequency signal in the series arm resonator 46 flows in a direction from the bottom electrode 111 to the top electrode 113. That is, the polarization direction for the flowing of a radio-frequency signal in the series arm resonator 45 is opposite to that in the series arm resonator 46. The series arm resonators 45 and 46 can thus propagate an acoustic wave by canceling out distortions of even-order distortion modes occurring between the series arm resonators 45 and 46 each other. The filter 12A is thus able to effectively reduce a leakage of unwanted waves of the second- and fourth-order distortion modes from the filter 12A.

The series arm resonators 45 and 46 having the above-described electrode configuration are connected to the terminal 15c at positions closer to the terminal 15c than the series arm resonator 47.

It is thus possible to effectively reduce a leakage of unwanted waves of the second- and fourth-order distortion modes that are generated in a resonator connected to the terminal 15c at a position closer to the terminal 15c than the other resonators.

In the multiplexer 10 according to the first embodiment, the filter 11A is capable of effectively reducing a leakage of unwanted waves of the third-order distortion mode, while the filter 12A is capable of effectively reducing a leakage of unwanted waves of the second- and fourth-order distortion modes. The multiplexer 10 is thus able to reduce the occurrence of unwanted waves of multiple major distortion modes.

In the above-described configuration of the filter 12A, instead of forming the bottom electrodes 111 of the series arm resonators 45 and 46 directly connected to each other on the second series arm path by using one electrode, the top electrodes 113 of the series arm resonators 45 and 46 may be formed by using one electrode.

Alternatively, in the filter 12A, the bottom electrodes 111 or the top electrodes 113 of the series arm resonators 46 and 47 directly connected to each other on the second series arm path may be formed by using one electrode.

Alternatively, in the filter 12A, the top electrode 113 or the bottom electrode 111 of the parallel arm resonator 55 directly connected to one end of the series arm resonator 46 and that of the parallel arm resonator 56 directly connected to the other end of the series arm resonator 46 may be formed by using one electrode. In this case, the top electrodes 113 or the bottom electrodes 111 of the parallel arm resonators 55 and 56 directly connected to each other are connected to a ground.

With this configuration, in the filter 12A, for example, a radio-frequency signal in the parallel arm resonator 55 flows in a direction from the top electrode 113 to the bottom electrode 111, while a radio-frequency signal in the parallel arm resonator 56 flows in a direction from the bottom electrode 111 to the top electrode 113. That is, the polarization direction for the flowing of a radio-frequency signal in the parallel arm resonator 55 is opposite to that in the parallel arm resonator 56. The parallel arm resonators 55 and 56 can thus propagate an acoustic wave by canceling out distortions of even-order distortion modes occurring between the parallel arm resonators 55 and 56 each other. The filter 12A is thus able to effectively reduce a leakage of unwanted waves of the second- and fourth-order distortion modes from the filter 12A.

The parallel arm resonators 55 and 56 having the above-described electrode configuration may be connected to the terminal 15c at positions closer to the terminal 15c than the other parallel arm resonators.

This makes it possible to effectively reduce a leakage of unwanted waves of the second- and fourth-order distortion modes from a resonator connected to the terminal 15c at a position closer to the terminal 15c than the other resonators.

Figure 5:
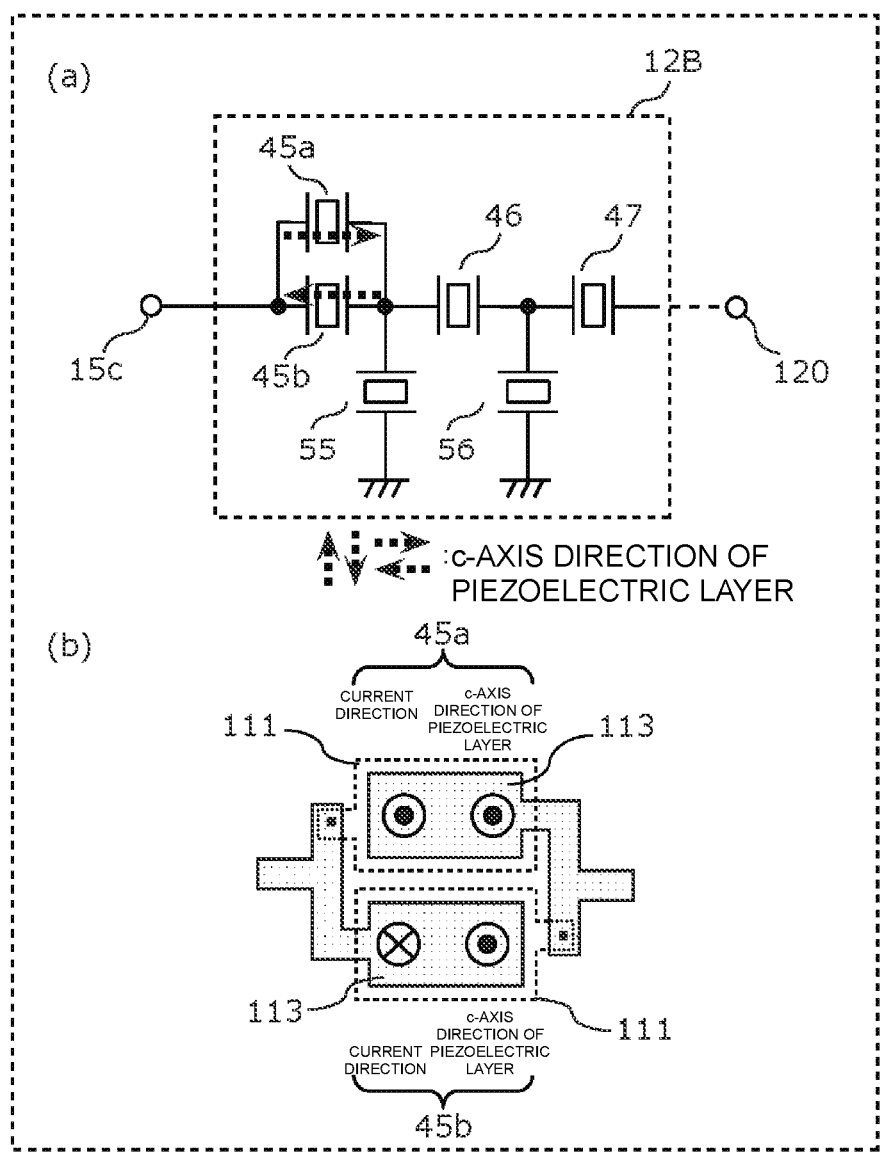
FIG. 5 includes two subparts: subpart

Subpart FIG. 5(a) of FIG. 5 is a circuit diagram of a filter 12B according to a modified example of the first embodiment. Subpart FIG. 5(b) of FIG. 5 illustrates the multilayer structure of parallel-divided resonators 45a and 45b. The filter 12B is an example of the second filter and includes the parallel-divided resonators 45a and 45b, series arm resonators 46 and 47, and parallel arm resonators 55 and 56.

Each of the parallel-divided resonators 45a and 45b and the series arm resonators 46 and 47 is an example of the second series arm resonator and is disposed on the second series arm path connecting the terminal 15c and the radio-frequency input terminal 120. Each of the parallel arm resonators 55 and 56 is an example of the second parallel arm resonator and the parallel arm resonators 55 and 56 are disposed on individual second parallel arm paths connecting the second series arm path and a ground. The parallel-divided resonators 45a and 45b are resonators obtained by dividing one series arm resonator in parallel.

The parallel-divided resonators 45a and 45b, the series arm resonators 46 and 47, and the parallel arm resonators 55 and 56 forming the filter 12B are all FBARs or all SMRs. Each of the parallel-divided resonators 45a and 45b, the series arm resonators 46 and 47, and the parallel arm resonators 55 and 56 includes a Si substrate 116 (second support substrate), a bottom electrode 111 (second bottom electrode) disposed above the Si substrate 116, a top electrode 113 (second top electrode) disposed above the bottom electrode 111, and a piezoelectric layer 112 (second piezoelectric layer) disposed between the bottom electrode 111 and the top electrode 113.

As illustrated in subpart FIG. 5(b) of FIG. 5, the top electrode 113 of the parallel-divided resonator 45a and the bottom electrode 111 of the parallel-divided resonator 45b are connected to each other. The bottom electrode 111 of the parallel-divided resonator 45a and the top electrode 113 of the parallel-divided resonator 45b are also connected to each other. With this configuration, the crystal forming the piezoelectric layer 112 formed between the bottom electrode 111 and the top electrode 113 is oriented on the bottom electrode 111 along the c axis (direction from the bottom electrode 111 to the top electrode 113), for example. In the filter 12B, for example, a radio-frequency signal in the parallel-divided resonator 45a flows in a direction from the bottom electrode 111 to the top electrode 113, while a radio-frequency signal in the parallel-divided resonator 45b flows in a direction from the top electrode 113 to the bottom electrode 111. That is, the polarization direction for the flowing of a radio-frequency signal in the parallel-divided resonator 45a is opposite to that in the parallel-divided resonator 45b. The parallel-divided resonators 45a and 45b can thus propagate an acoustic wave by canceling out distortions of even-order distortion modes occurring between the parallel-divided resonators 45a and 45b each other. The filter 12B is thus able to effectively reduce a leakage of unwanted waves of the second- and fourth-order distortion modes from the filter 12B.

In the multiplexer 10 according to the modified example of the first embodiment, the filter 11A is capable of effectively reducing a leakage of unwanted waves of the third-order distortion mode, while the filter 12B is capable of effectively reducing a leakage of unwanted waves of the second- and fourth-order distortion modes. The multiplexer 10 of the modified example is thus able to reduce the occurrence of unwanted waves of multiple major distortion modes.

The parallel-divided resonators 45a and 45b are connected to the terminal 15c at positions closer to the terminal 15c than the series arm resonators 46 and 47 and the parallel arm resonators 55 and 56.

It is thus possible to effectively reduce a leakage of unwanted waves of the second- and fourth-order distortion modes that are generated in a resonator connected to the terminal 15c at a position closer to the terminal 15c than the other resonators.

In the above-described configuration of the filter 12B, at least one of the series arm resonators 46 and 47 and the parallel arm resonators 55 and 56 may be constituted by two parallel-divided resonators, and the top electrode 113 of one of the parallel-divided resonators and the bottom electrode 111 of the other one of the parallel-divided resonators may be connected to each other.

This enables the filter 12B to effectively reduce a leakage of unwanted waves of the second- and fourth-order distortion modes from the filter 12B.

In the multiplexer 10 according to the first embodiment, the relative dielectric constant of the piezoelectric layer 112 (first piezoelectric layer) of a BAW resonator forming the filter 11A may be lower than that of the piezoelectric layer 112 (second piezoelectric layer) of a BAW resonator forming the filter 12A. An example of the first piezoelectric layer having a lower relative dielectric constant than the second piezoelectric layer is a piezoelectric layer containing aluminum nitride. An example of the second piezoelectric layer having a higher relative dielectric constant than the first piezoelectric layer is a piezoelectric layer containing lithium niobate or lithium tantalate.

Dividing a BAW resonator of the filter 11A in series can increase the area of the BAW resonator, thereby enhancing the electric power handling capability. On the other hand, increasing the relative dielectric constant of the piezoelectric layer 112 of the filter 12A to a higher level than that of the filter 11A can decrease the area of the BAW resonator forming the filter 12A. With this configuration, the multiplexer 10 can reduce the occurrence of unwanted waves of multiple major distortion modes without making the total area of the filters 11A and 12A large.

Second Embodiment

In a multiplexer according to a second embodiment, more filters are connected to the same antenna connecting terminal 100 than those in the multiplexer 10 according to the first embodiment.

[2.1 Circuit Configurations of Multiplexer 10A, Radio-Frequency Module 1A, and Communication Apparatus 5A]

Figure 6:
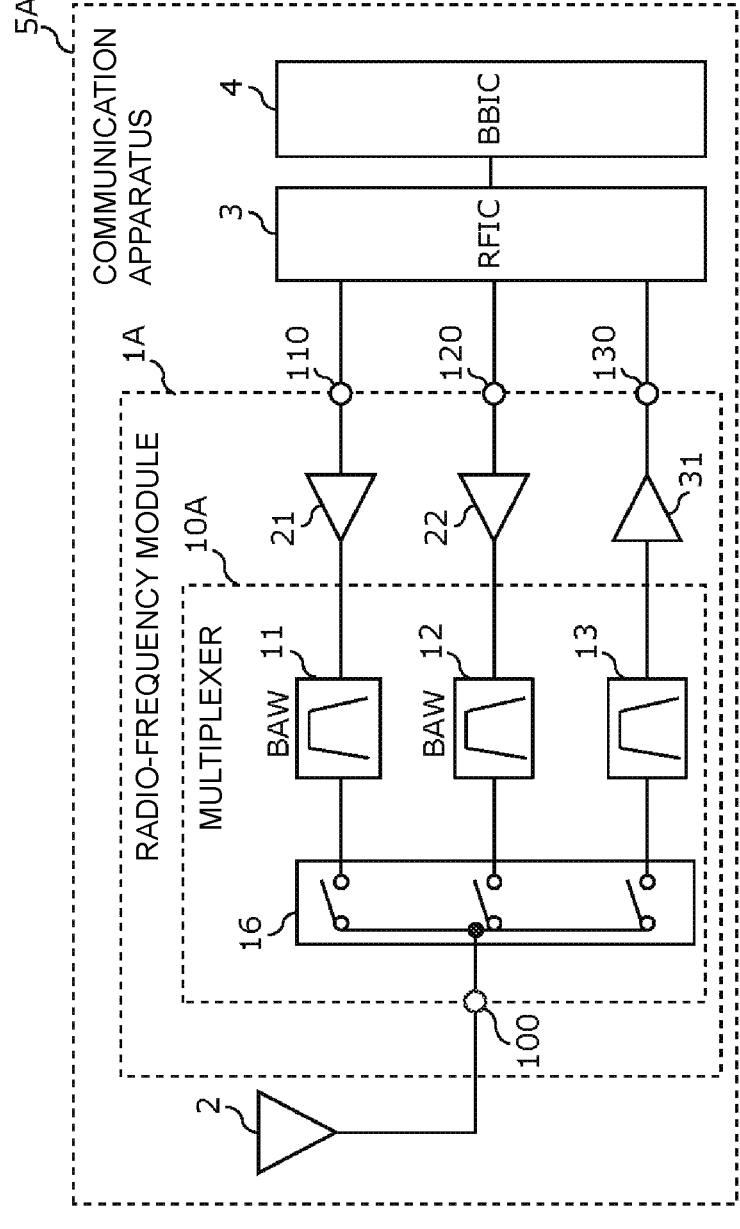
FIG. 6 is a circuit block diagram of a multiplexer, a radio-frequency module, and a communication apparatus according to a second embodiment.

FIG. 6 is a circuit block diagram of a multiplexer 10A, a radio-frequency module 1A, and a communication apparatus 5A according to the second embodiment. As illustrated in FIG. 6, the communication apparatus 5A includes the radio-frequency module 1A, an antenna 2, an RFIC 3, and a BBIC 4. The communication apparatus 5A according to the second embodiment is different from the communication apparatus 5 according to the first embodiment only in the configuration of the radio-frequency module 1A. The configuration of the radio-frequency module 1A will be discussed below.

As illustrated in FIG. 6, the radio-frequency module 1A includes the multiplexer 10A, power amplifiers 21 and 22, a low-noise amplifier 31, radio-frequency input terminals 110 and 120, and a radio-frequency output terminal 130. The radio-frequency module 1A of the second embodiment is different from the radio-frequency module 1 of the first embodiment in that the configuration of the multiplexer 10A is different and that the radio-frequency output terminal 130 and the low-noise amplifier 31 are added. The multiplexer 10A of the second embodiment will be described below with reference to FIG. 6 mainly by referring to the points different from the multiplexer 10 of the first embodiment while omitting an explanation of the components configured similarly to those of the multiplexer 10.

The radio-frequency output terminal 130 is a terminal for outputting a radio-frequency received signal to the outside of the radio-frequency module 1A.

The multiplexer 10A includes filters 11, 12, and 13, a switch 16, and an antenna connecting terminal 100.

The filter 13 is an example of a third filter. The filter 13 is connected to the antenna connecting terminal 100 via the switch 16 and has a third pass band including a third band.

The third band refers to a frequency band defined by a standardizing body (such as 3GPP and IEEE) for a communication system to be constructed using a RAT. In the second embodiment, as the communication system, an LTE system, a 5G-NR system, and a WLAN system, for example, may be used. However, the communication system is not limited to these types of systems.

The switch 16 has three SPST switch elements. One of the terminals of each of the switch elements is connected to the antenna connecting terminal 100. The other respective terminals of the switch elements are connected to the filters 11, 12, and 13. With this configuration, based on a control signal from the RFIC 3, for example, the switch 16 selectively connects or disconnects the antenna connecting terminal 100 to or from the filter 11, selectively connects or disconnects the antenna connecting terminal 100 to or from the filter 12, and selectively connects or disconnects the antenna connecting terminal 100 to or from the filter 13. The number of switch elements of the switch 16 is suitably set in accordance with the number of filters of the multiplexer 10A.

The low-noise amplifier 31 is connected between the filter 13 and the radio-frequency output terminal 130. The low-noise amplifier 31 is able to amplify a received signal input from the antenna connecting terminal 100 and output from the filter 13.

In the multiplexer 10A, the provision of the switch 16 may be omitted. In this case, the filters 11, 12, and 13 may be directly connected to the antenna connecting terminal 100.

An impedance matching circuit may be inserted between the filter 13 and the low-noise amplifier 31. An impedance matching circuit may be inserted between the antenna connecting terminal 100 and the filter 13.

The filter 13 may be any one of a SAW filter, a BAW filter, an LC resonance filter using an inductor and a capacitor, a hybrid filter using an acoustic wave resonator, an inductor, and a capacitor, and a dielectric filter. The filter 13 may be a filter other than these types of filters.

[2.2 Signal Distortion Resistance of Multiplexer 10A]

In the radio-frequency module 1A, when a first sending signal (frequency f1) of the first band output from the power amplifier 21 and a second sending signal (frequency f2) of the second band output from the power amplifier 22 are being transmitted simultaneously, the sending signal from one of the amplifiers 21 and 22 may leak to the other one of the amplifiers 22 and 21 (or the corresponding filter 12 or 11). Then, the sending signal from the amplifier 21 or 22 having leaked to the other amplifier 22 or 21 (or the filter 12 or 11) and the sending signal of the other amplifier 22 or 21 (or the filter 12 or 11) are mixed in the filter 12 or 11 and the amplifier 22 or 21, thereby causing the occurrence of intermodulation distortion (hereinafter may simply be called IMD). Additionally, the first sending signal output from the power amplifier 21 causes the occurrence of harmonic distortion (hereinafter may simply be called HD) due to the nonlinear operation of the power amplifier 21 and the filter 11. The second sending signal output from the power amplifier 22 also causes the occurrence of HD due to the nonlinear operation of the power amplifier 22 and the filter 12. The IMD and the HD will collectively be called unwanted waves of distortion modes. Among unwanted waves of distortion modes, the power level of unwanted waves of the second-, third-, and fourth-order distortion modes are higher than that of unwanted waves of the other orders.

If a signal having the frequency of an unwanted wave of one of major distortion modes, that is, the second-, third-, and fourth-order distortion modes, flows into the signal path of the radio-frequency module 1A, the radio-frequency module 1A fails to satisfy a predetermined level of the signal quality or the receive sensitivity of the radio-frequency module 1A is lowered.

To address unwanted waves of the above-described major distortion modes, the multiplexer 10A has the following characteristics.

The filter 11 is capable of reducing the occurrence of unwanted waves of the third-order distortion mode. The filter 12 is capable of reducing the occurrence of unwanted waves of the second- and fourth-order distortion modes.

[2.3 Signal Propagation State of Radio-Frequency Module 1A]

Figure 7A:
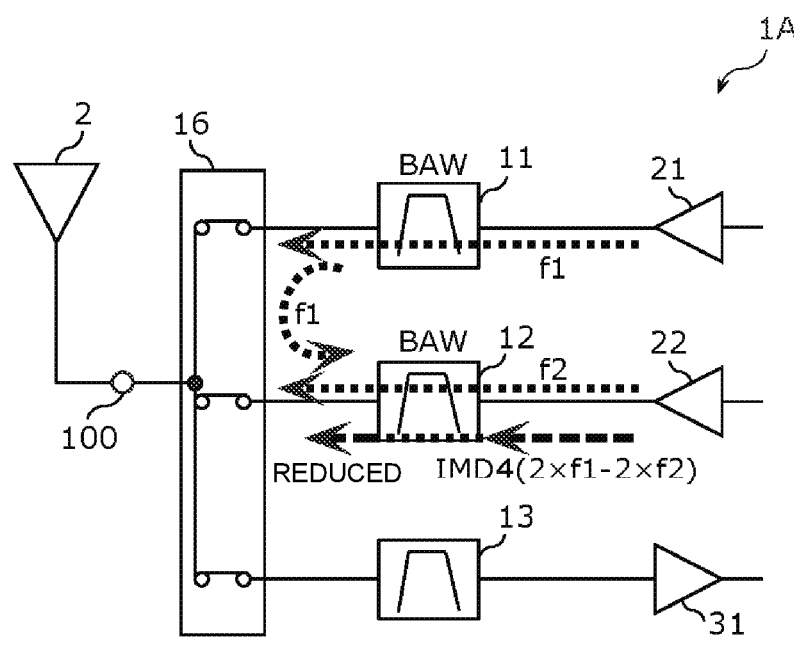
FIG. 7A illustrates a propagation state of a sending signal and an unwanted wave of the fourth-order distortion mode in the radio-frequency module of the second embodiment.

FIG. 7A illustrates a propagation state of a sending signal and an unwanted wave of the fourth-order distortion mode in the radio-frequency module 1A of the second embodiment. More specifically, FIG. 7A illustrates a state in which the first sending signal (frequency f1) output from the power amplifier 21 flows into the filter 12 or the power amplifier 22 via the switch 16, thereby generating IMD4 ($2 \times f1 - 2 \times f2$), together with the second sending signal (frequency f2) output from the power amplifier 22. The frequency of IMD4 is included in the second pass band of the filter 12. An unwanted wave of IMD4 is thus output from the antenna connecting terminal 100, together with the second sending signal. As described above, however, the filter 12 constituted by one or more BAW resonators is capable of reducing the occurrence of unwanted waves of the second- and fourth-order distortion modes. The above-described unwanted wave of IMD4 is thus less likely to output from the filter 12.

Figure 7B:
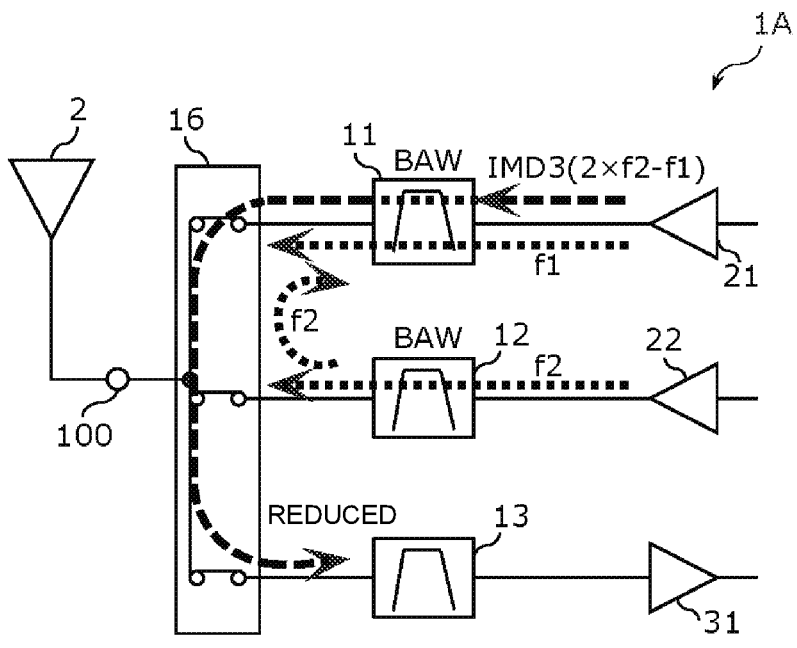
FIG. 7B illustrates a propagation state of a sending signal and an unwanted wave of the third-order distortion mode in the radio-frequency module of the second embodiment.

FIG. 7B illustrates a propagation state of a sending signal and an unwanted wave of the third-order distortion mode in the radio-frequency module 1A of the second embodiment. More specifically, FIG. 7B illustrates a state in which the second sending signal (frequency f2) output from the power amplifier 22 flows into the filter 11 or the power amplifier 21 via the switch 16, thereby generating IMD3 ($2 \times f2 - f1$), together with the first sending signal (frequency f1) output from the power amplifier 21. The frequency of IMD3 is included in the third pass band of the filter 13. An unwanted wave of IMD3 thus flows into the low-noise amplifier 31 via the switch 16 and the filter 13. As described above, however, the filter 11 constituted by one or more BAW resonators is capable of reducing the occurrence of unwanted waves of the third-order distortion mode. The above-described unwanted wave of IMD3 is thus less likely to output from the filter 11.

That is, in the multiplexer 10A according to the second embodiment, the frequency of an unwanted wave of the second- or fourth-order distortion mode, which is generated when the first sending signal of the first band and the second sending signal of the second band are simultaneously transmitted, is included in at least one of the first pass band, second pass band, and third pass band. Additionally, the frequency of an unwanted wave of the third-order distortion mode, which is generated when the first sending signal of the first band and the second sending signal of the second band are simultaneously transmitted, is included in at least one of the first pass band, second pass band, and third pass band.

Nevertheless, the multiplexer 10A includes the filter 12 having a higher capability to reduce the occurrence of unwanted waves of the second- and fourth-order distortion modes than the filter 11 and also includes the filter 11 having a higher capability to reduce the occurrence of unwanted waves of the third-order distortion mode than the filter 12. The multiplexer 10A can thus smoothen and reduce unwanted waves of multiple major (second-, third-, and fourth-order) distortion modes.

Table 1 illustrates examples of the combination of the first band, second band, and third band (or fourth band) and IMD2, IMD3, and IMD4 that are generated in accordance with the combination of the first band, second band, and third band (or fourth band).

In example 1 shown in Table 1, the first band is 5G-NR n46 (5.150 to 5.925 GHz), the second band is 5G-NR n77 (3.3 to 4.2 GHZ) or 5G-NR n78 (3.3 to 3.8 GHZ), and the third band is LTE Band 3. In example 1, when the first sending signal and the second sending signal are simultaneously transmitted, IMD2, IMD3, and IMD4 are generated. The frequency of IMD2 is included in the third band. The frequency of IMD3 is included in the third band. The frequencies of IMD4 are included in the first band and the second band.

In example 2 shown in Table 1, the first band is 5G-NR n46, the second band is 5G-NR n77, and the third band is LTE Band 2. In example 2, when the first sending signal and the second sending signal are simultaneously transmitted, IMD2, IMD3, and IMD4 are generated. The frequency of IMD2 is included in the third band. The frequency of IMD3 is included in the third band. The frequencies of IMD4 are included in the first band and the second band.

In example 3 shown in Table 1, the first band is 5G-NR n77, the second band is 5G-NR n41 (2.496 to 2.690 GHz), and the third band is 5G-NR n46. In example 3, when the first sending signal and the second sending signal are simultaneously transmitted, IMD3 and IMD4 are generated. The frequency of IMD3 is included in the third band. The frequencies of IMD4 are included in the first band and the second band.

In example 4 shown in Table 1, the first band is 5G-NR n41, the second band is 5G-NR n40 (2.3 to 2.4 GHZ), and the third band is 5G-NR n79 (4.4 to 5.0 GHZ). In example 4, when the first sending signal and the second sending signal are simultaneously transmitted, IMD3 and IMD4 are generated. The frequencies of IMD3 are included in the first band and the second band. The frequency of IMD4 is included in the third band.

In example 5 shown in Table 1, the first band is 5G-NR n79, the second band is 5G-NR n77 or 5G-NR n78, and the

TABLE 1

| Example | First band f1 GHz | Second band f2 GHz | Third band or fourth band | IMD2 (GHz) | IMD3 (GHz) | IMD4 (GHz) |
|---|---|---|---|---|---|---|
| 1 | n46 5.55 | n77 n78 3.7 | B3 | B3-Rx(f1-f2) 1.85(5.55-3.7) | B3-Rx(2f2-f1) 1.85(2 × 3.7-5.55) | n77/n78(2f1-2f2) 3.7(2 × 5.55-2 × 3.7) n46(3f2-f1) 5.55(3 × 3.7-5.55) |
| 2 | n46 5.8 | n77 3.85 | B2 | B2-Rx(f1-f2) 1.95(5.8-3.85) | B2-Tx(2f2-f1) 1.9(2 × 3.85-5.8) | n77(2f1-2f2) 3.9(2 × 5.8-2 × 3.85) n46(3f2-f1) 5.75(3 × 3.85-5.8) |
| 3 | n77 3.84 | n41 2.5 | n46 | | n46 (2f1-f2) 5.18(2 × 3.84-2.5) | n41(2f1-2f2) 2.68(2 × 3.84-2 × 2.5) n77(3f2-f1) 3.66(3 × 2.5-3.84) |
| 4 | n41 2.5 | n40 2.4 | n79 | | n40(2f2-f1) 2.3(2 × 2.4-2.5) n41(2f1-f2) 2.6(2 × 2.5-2.4) | n79(3f2-f1) 4.7(3 × 2.4-2.5) |
| 5 | n79 4.8 | n77 n78 3.6 | WLAN n40 | n40(2f2-f1) 2.4(2 × 3.6-4.8) WLAN(2f1-f2) 6.0(2 × 4.8-3.6) | n40(2f1-2f2) 2.4(2 × 4.8-2 × 3.6) WLAN(3f2-f1) 6.0(3 × 3.6-4.8) |
| 6 | n46 5.26 | n77 4.2 | WLAN B1 | WLAN(2f1-f2) 6.32(2 × 5.26-4.2) | B1Rx(2f1-2f2) 2.12(2 × 5.26-2 × 4.2) |
| 7 | n46 5.78 | n79 4.9 | WLAN n77 B1 | n77(2f2-f1) 4.02(2 × 4.9-5.78) WLAN(2f1-f2) 6.66(2 × 5.78-4.9) | B1Tx(2f1-2f2) 1.76(2 × 5.78-2 × 4.9) |
| 8 | n96 6.28 | n46 5.2 | n77 B1 | n77(2f2-f1) 4.12(2 × 5.2-6.28) | B1Rx(2f1-2f2) 2.16(2 × 6.28-2 × 5.2) | third band is 5G-NR n40 or WLAN. In example 5, when the first sending signal and the second sending signal are simultaneously transmitted, IMD3 and IMD4 are generated. The frequency of IMD3 is included in the third band. The frequency of IMD4 is included in the third band.

In addition to the filters 11, 12, and 13, the multiplexer 10A of the second embodiment may include a fourth filter connected to the antenna connecting terminal 100 and having a fourth pass band including a fourth band. The frequency of an unwanted wave of the second- or fourth-order distortion mode, which is generated when the first sending signal of the first band and the second sending signal of the second band are simultaneously transmitted, may be included in at least one of the first pass band, second pass band, third pass band, and fourth pass band. The frequency of an unwanted wave of the third-order distortion mode, which is generated when the first sending signal of the first band and the second sending signal of the second band are simultaneously transmitted, may be included in at least one of the first pass band, second pass band, third pass band, and fourth pass band.

With the above-described configuration, too, the multiplexer 10A can reduce unwanted waves of multiple major (second-, third-, and fourth-order) distortion modes.

In the above-described configuration, in example 6 shown in Table 1, the first band is 5G-NR n46, the second band is 5G-NR n77 or 5G-NR n78, the third band is WLAN, and the fourth band is LTE Band 1. In example 6, when the first sending signal and the second sending signal are simultaneously transmitted, IMD3 and IMD4 are generated. The frequency of IMD3 is included in the third band. The frequency of IMD4 is included in the fourth band.

In example 7 shown in Table 1, the first band is 5G-NR n46, the second band is 5G-NR n79, the third band is WLAN or 5G-NR n77, and the fourth band is LTE Band 1. In example 7, when the first sending signal and the second sending signal are simultaneously transmitted, IMD3 and IMD4 are generated. The frequency of IMD3 is included in the third band. The frequency of IMD4 is included in the fourth band.

In example 8 shown in Table 1, the first band is 5G-NR n96 (5.925 to 6.425 GHz), the second band is 5G-NR n46, the third band is 5G-NR n77, and the fourth band is LTE Band 1. In example 8, when the first sending signal and the second sending signal are simultaneously transmitted, IMD3 and IMD4 are generated. The frequency of IMD3 is included in the third band. The frequency of IMD4 is included in the fourth band.

[2.4 SMR BAW Filter]

The structure of a multiplexer 10B according to a modified example of the second embodiment whose first filter (filter 13A) is constituted by one or more SMR BAW resonators will now be discussed below.

Figure 8:
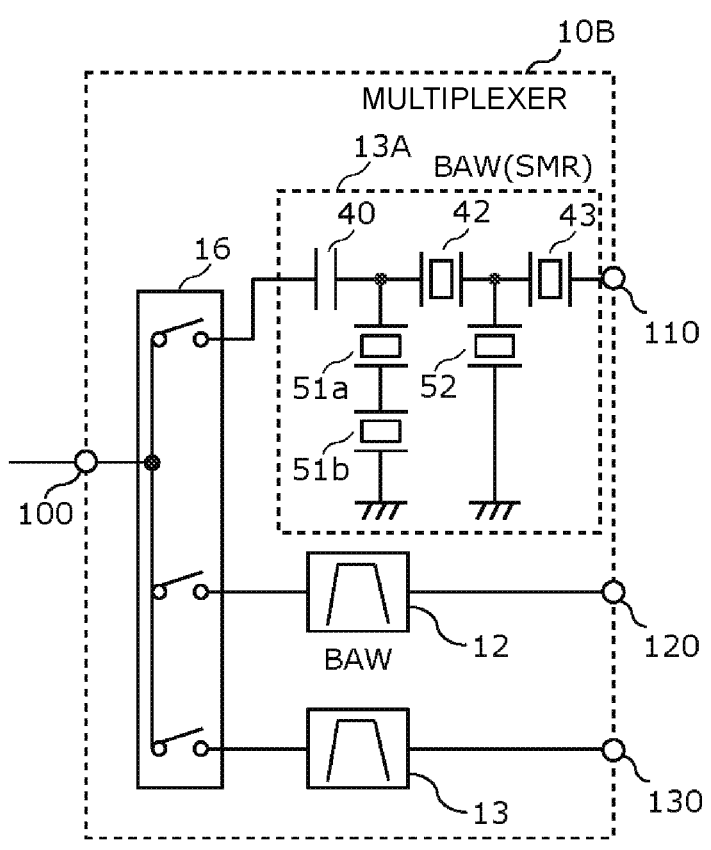
FIG. 8 is a circuit diagram of a multiplexer according to a modified example of the second embodiment.

FIG. 8 is a circuit diagram of the multiplexer 10B according to a modified example of the second embodiment. As illustrated in FIG. 8, the multiplexer 10B includes filters 13A, 12, and 13, a switch 16, and an antenna connecting terminal 100. The multiplexer 10B of the modified example of the second embodiment is different from the multiplexer 10A of the second embodiment only in the configuration of the filter 13A (first filter), which is a BAW filter. The multiplexer 10B of the modified example will be described below with reference to FIG. 8 mainly by referring to the points different from the multiplexer 10A of the second embodiment while omitting an explanation of the components configured similarly to those of the multiplexer 10A.

The filter 13A, which is an example of the first filter, includes a capacitor element 40, series arm resonators 42 and 43, series-divided resonators 51a and 51b, and a parallel arm resonator 52.

Each of the series arm resonators 42 and 43 is an example of the first series arm resonator and is disposed on a first series arm path connecting a first selection terminal of the switch 16 and the radio-frequency input terminal 110. Each of the series-divided resonators 51a and 51b is an example of the first parallel arm resonator. The series-divided resonators 51a and 51b are resonators obtained by dividing one parallel arm resonator in series and are disposed on a first parallel arm path connecting the first series arm path and a ground. The parallel arm resonator 52 is an example of the first parallel arm resonator and is disposed on another first parallel arm path connecting the first series arm path and a ground. Each of the series arm resonators 42 and 43, the series-divided resonators 51a and 51b, and the parallel arm resonator 52 is an SMR.

The capacitor element 40 is connected between the first selection terminal of the switch 16 and resonators (series arm resonator 42 and series-divided resonator 51a), which are connected to the first selection terminal of the switch 16 at positions closer to the first selection terminal than the series arm resonator 43, the series-divided resonator 51b, and the parallel arm resonator 52.

The capacitor element 40, which has a lower nonlinearity than acoustic wave resonators, is disposed most closely to the antenna connecting terminal 100. Arranging the capacitor element 40 in this manner can effectively reduce a leakage of unwanted waves of distortion modes from the filter 13A toward the antenna connecting terminal 100.

If the filter 12 is an SMR, a capacitor element of the filter 12 may be connected between a second selection terminal of the switch 16 and a resonator which is connected to the second selection terminal at a position closer to the second selection terminal than the other resonators forming the second series arm resonators and the second parallel arm resonators of the filter 12.

This makes it possible to effectively reduce a leakage of unwanted waves of distortion modes from the filter 12 toward the antenna connecting terminal 100.

[2.5 Layout of Radio-Frequency Module 1A]

The arrangement layout of circuit components forming the radio-frequency module 1A will be discussed below.

Figure 9:
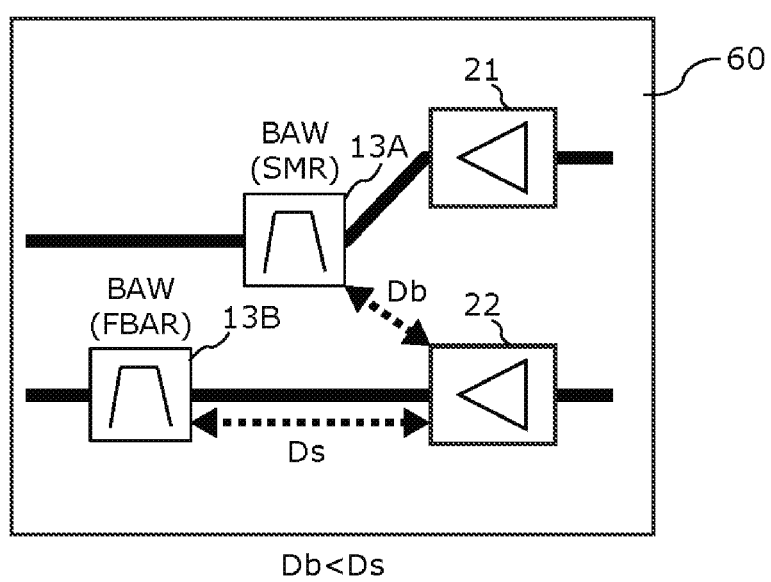
FIG. 9 is a schematic plan view illustrating the arrangement layout of acoustic wave filters and power amplifiers of the radio-frequency module according to the second embodiment.

FIG. 9 is a schematic plan view illustrating the arrangement layout of the filter 13A (first filter), the filter 13B (second filter), and the power amplifiers 21 and 22 of the radio-frequency module 1A according to the second embodiment.

As illustrated in FIG. 9, the radio-frequency module 1A includes a module laminate 60 in addition to the components of the radio-frequency module 1A shown in FIG. 6.

The module laminate 60 is a substrate used for mounting the filters 13A and 13B and the power amplifiers 21 and 22 on its main surface. Examples of the module laminate 60 are a low temperature co-fired ceramics (LTCC) substrate, a high temperature co-fired ceramics (HTCC) substrate, a component-embedded board, a substrate having a redistribution layer (RDL), and a printed substrate, each of which has a multilayer structure constituted by plural dielectric layers.

The filter 13A is an example of the first filter, and the BAW resonator forming the filter 13A is an SMR. The filter 13B is an example of the second filter, and the BAW resonator forming the filter 13B is an FBAR.

As illustrated in FIG. 9, when the main surface of the module laminate 60 is viewed from above, the distance Db between the filter 13A and the power amplifier 22 is smaller than the distance Ds between the filter 13B and the power amplifier 22.

The heat dissipation characteristics of the filter 13B constituted by an FBAR are lower than those of the filter 13A constituted by an SMR. That is, when a sending signal is transmitted, the temperature is more likely to rise in the filter 13B than in the filter 13A. With the above-described layout of the radio-frequency module 1A, the distance between the filter 13B and the power amplifier 22 is relatively large, thereby making it possible to regulate a temperature rise of the filter 13B responding to a temperature rise of the radio-frequency module 1A caused by heat generated in the power amplifier 22 to a smaller level. The radio-frequency module 1A is thus able to achieve signal transmission with a smaller loss by suppressing the degradation of the characteristics caused by a temperature rise.

The filters 13A and 13B may be stacked on each other in the same package. This can reduce the size of the radio-frequency module 1A. In this case, when the package is seen in cross section, the distance of the filter 13B to the power amplifier 22 is larger than that of the filter 13A to the power amplifier 22, thereby making it possible to regulate a temperature rise in the filter 13B to a smaller level. Alternatively, the filter 13A is placed at a position closer to the surface to be mounted on the module laminate 60 than the filter 13B is, so that the distance of the filter 13B to the power amplifier 22 becomes larger than that of the filter 13A to the power amplifier 22. This can regulate a temperature rise in the filter 13B to a smaller level.

In the modified example of the second embodiment, the first filter is constituted by an SMR, while the second filter is constituted by an FBAR. Alternatively, the first filter may be constituted by an FBAR, while the second filter may be constituted by an SMR. In this case, when the main surface of the module laminate 60 is viewed from above, the distance Db between the second filter and the power amplifier 22 is smaller than the distance Ds between the first filter and the power amplifier 22.

This makes it possible to regulate a temperature rise of the first filter responding to a temperature rise of the radio-frequency module 1A caused by heat generated in the power amplifier 22 to a smaller level. The radio-frequency module 1A is thus able to achieve signal transmission with a smaller loss.

(Advantages and Others)

The multiplexer 10 according to an embodiment includes the filters 11 and 12. The filter 11 is connected to the antenna connecting terminal 100 and has a first pass band including a first band which can be used for sending a signal. The filter 12 is connected to the antenna connecting terminal 100 and has a second pass band including a second band which can be used for sending a signal. The filter 11 includes a first series arm resonator and a first parallel arm resonator. The first series arm resonator is disposed on a first series arm path connecting the antenna connecting terminal 100 and the radio-frequency input terminal 110. The first parallel arm resonator is disposed on a first parallel arm path connecting the first series arm path and a ground. Each of the first series arm resonator and the first parallel arm resonator includes the Si substrate 116, the bottom electrode 111 disposed above the Si substrate 116, the top electrode 113 disposed above the bottom electrode 111, and the piezoelectric layer 112 disposed between the bottom electrode 111 and the top electrode 113. At least one of resonators forming the first series arm resonator and the first parallel arm resonator is constituted by the series-divided resonators 41a and 41b connected in series with each other. The filter 12 includes plural second series arm resonators and a second parallel arm resonator. The plural second series arm resonators are disposed on a second series arm path connecting the antenna connecting terminal 100 and the radio-frequency input terminal 120. The second parallel arm resonator is disposed on a second parallel arm path connecting the second series arm path and a ground. Each of the plural second series arm resonators and the second parallel arm resonator includes the Si substrate 116, the bottom electrode 111 disposed above the Si substrate 116, the top electrode 113 disposed above the bottom electrode 111, and the piezoelectric layer 112 disposed between the bottom electrode 111 and the top electrode 113. Regarding the two adjacent series arm resonators 45 and 46 of the plural second series arm resonators, the top electrodes 113 or the bottom electrodes 111 of the series arm resonators 45 and 46 are formed by one electrode.

With the above-described configuration, the filter 11 is capable of effectively reducing a leakage of unwanted waves of the third-order distortion mode, while the filter 12 is capable of effectively reducing a leakage of unwanted waves of the second- and fourth-order distortion modes. The multiplexer 10 is thus able to reduce the occurrence of unwanted waves of multiple major distortion modes.

The multiplexer 10 according to an embodiment includes the filters 11 and 12. The filter 11 is connected to the antenna connecting terminal 100 and has a first pass band including a first band which can be used for sending a signal. The filter 12 is connected to the antenna connecting terminal 100 and has a second pass band including a second band which can be used for sending a signal. The filter 11 includes a first series arm resonator disposed on a first series arm path and a first parallel arm resonator disposed on a first parallel arm path. The filter 12 includes a second series arm resonator disposed on a second series arm path and plural second parallel arm resonators disposed on individual second parallel arm paths. Each of the second series arm resonator and the plural second parallel arm resonators includes the Si substrate 116, the bottom electrode 111 disposed above the Si substrate 116, the top electrode 113 disposed above the bottom electrode 111, and the piezoelectric layer 112 disposed between the bottom electrode 111 and the top electrode 113. Among the plural second parallel arm resonators, regarding the parallel arm resonator 55 directly connected to one end of the series arm resonator 46 and the parallel arm resonator 56 directly connected to the other end of the series arm resonator 46, the top electrodes 113 or the bottom electrodes 111 of the parallel arm resonators 55 and 56 are formed by one electrode.

With the above-described configuration, the filter 11 is capable of effectively reducing a leakage of unwanted waves of the third-order distortion mode, while the filter 12 is capable of effectively reducing a leakage of unwanted waves of the second- and fourth-order distortion modes. The multiplexer 10 is thus able to reduce the occurrence of unwanted waves of multiple major distortion modes.

The multiplexer 10 according to an embodiment includes the filters 11 and 12. The filter 11 is connected to the antenna connecting terminal 100 and has a first pass band including a first band which can be used for sending a signal. The filter 12 is connected to the antenna connecting terminal 100 and has a second pass band including a second band which can be used for sending a signal. The filter 11 includes a first series arm resonator disposed on a first series arm path and a first parallel arm resonator disposed on a first parallel arm path. The filter 12 includes a second series arm resonator disposed on a second series arm path and a second parallel arm resonator disposed on a second parallel arm path. At least one of resonators forming the second series arm resonator and the second parallel arm resonator is constituted by the parallel-divided resonators 45a and 45b connected in parallel with each other. Each of the second series arm resonator and the second parallel arm resonator includes the Si substrate 116, the bottom electrode 111 disposed above the Si substrate 116, the top electrode 113 disposed above the bottom electrode 111, and the piezoelectric layer 112 disposed between the bottom electrode 111 and the top electrode 113. The top electrode 113 of the parallel-divided resonator 45a and the bottom electrode 111 of the parallel-divided resonator 45b are connected to each other.

With the above-described configuration, the filter 11 is capable of effectively reducing a leakage of unwanted waves of the third-order distortion mode, while the filter 12 is capable of effectively reducing a leakage of unwanted waves of the second- and fourth-order distortion modes. The multiplexer 10 is thus able to reduce the occurrence of unwanted waves of multiple major distortion modes.

The multiplexer 10A may further include the filter 13 connected to the antenna connecting terminal 100 and having a third pass band including a third band. The frequency of an unwanted wave of the second- or fourth-order distortion mode, which is generated when a first sending signal of the first band and a second sending signal of the second band are simultaneously transmitted, may be included in at least one of the first pass band, second pass band, and third pass band. The frequency of an unwanted wave of the third-order distortion mode, which is generated when the first sending signal of the first band and the second sending signal of the second band are simultaneously transmitted, may be included in at least one of the first pass band, second pass band, and third pass band.

With this configuration, the multiplexer 10A includes the filter 12 having a higher capability to reduce the occurrence of unwanted waves of the second- and fourth-order distortion modes than the filter 11 and also includes the filter 11 having a higher capability to reduce the occurrence of unwanted waves of the third-order distortion mode than the filter 12. The multiplexer 10A can thus smoothen and reduce unwanted waves of multiple major (second-, third-, and fourth-order) distortion modes.

In the multiplexer 10A, the first band may be 5G-NR n46, the second band may be 5G-NR n77 or 5G-NR n78, and the third band may be LTE Band 3.

In the multiplexer 10A, the first band may be 5G-NR n46, the second band may be 5G-NR n77, and the third band may be LTE Band 2.

In the multiplexer 10A, the first band may be 5G-NR n77, the second band may be 5G-NR n41, and the third band may be 5G-NR n46.

In the multiplexer 10A, the first band may be 5G-NR n41, the second band may be 5G-NR n40, and the third band may be 5G-NR n79.

In the multiplexer 10A, the first band may be 5G-NR n79, the second band may be 5G-NR n77 or 5G-NR n78, and the third band may be 5G-NR n40 or WLAN.

In the multiplexer 10, the series-divided resonators 41a and 41b may be connected to the antenna connecting terminal 100 at positions closer to the antenna connecting terminal 100 than the other resonators forming the first series arm resonator and the first parallel arm resonator.

This can reduce the power density of a resonator connected at the closest position to the antenna connecting terminal 100. A radio-frequency signal to be output from the filter 11A toward the terminal 15b is thus less likely to become nonlinear, thereby making it possible to effectively reduce a leakage of unwanted waves of distortion modes from the filter 11A.

In the multiplexer 10, the series arm resonators 45 and 46 may be connected to the antenna connecting terminal 100 at positions closer to the antenna connecting terminal 100 than the other resonators forming the plural second series arm resonators.

This can effectively reduce a leakage of unwanted waves of the second- and fourth-order distortion modes from a resonator connected at the closest position to the antenna connecting terminal 100.

In the multiplexer 10, the parallel arm resonators 55 and 56 may be connected to the antenna connecting terminal 100 at positions closer to the antenna connecting terminal 100 than the other resonators forming the plural second parallel arm resonators.

This can effectively reduce a leakage of unwanted waves of the second- and fourth-order distortion modes from a resonator connected at the closest position to the antenna connecting terminal 100.

In the multiplexer 10, the parallel-divided resonators 45a and 45b may be connected to the antenna connecting terminal 100 at positions closer to the antenna connecting terminal 100 than the other resonators forming the second series arm resonator and the second parallel arm resonator.

This can effectively reduce a leakage of unwanted waves of the second- and fourth-order distortion modes from a resonator connected at the closest position to the antenna connecting terminal 100.

In the multiplexer 10, the relative dielectric constant of the piezoelectric layer 112 of the filter 11A may be lower than that of the filter 12A.

Dividing a BAW resonator of the filter 11A in series can increase the area of the BAW resonator, thereby enhancing the electric power handling capability. On the other hand, increasing the relative dielectric constant of the piezoelectric layer 112 of the filter 12A to a higher level than that of the filter 11A can decrease the area of the BAW resonator forming the filter 12A. With this configuration, the multiplexer 10 can reduce the occurrence of unwanted waves of multiple major distortion modes without making the total area of the filters 11A and 12A large.

In the multiplexer 10, each resonator of one of the filters 11 and 12 may be an FBAR, while each resonator of the other one of the filters 11 and 12 may be an SMR. The pass band of one of the filters 11 and 12 whose resonators are FBARs may be positioned at a lower frequency side than that of the other one of the filters 11 and 12 whose resonators are SMRs.

Forming the filter having a pass band on the lower frequency side by using an FBAR can reduce unwanted waves of higher-order modes that may occur in the pass band of the filter on the higher frequency side. The FBAR filter can allow the piezoelectric layer 112 to freely vibrate because of the provision of the cavity 117, thereby enhancing the resonance Q factor and reducing the insertion loss. It is thus possible to reduce the insertion loss of the filters 11 and 12, thereby implementing the small-loss multiplexer 10.

In the multiplexer 10, the SMR filter, which is one of the filters 11 and 12, may include the capacitor element 40 that is connected between the antenna connecting terminal 100 and a resonator connected to the antenna connecting terminal 100 at a position closer to the antenna connecting terminal 100 than the other resonators forming the series arm resonator and the parallel arm resonator. The capacitor element 40, which has a lower nonlinearity than acoustic wave resonators, is disposed most closely to the antenna connecting terminal 100. Arranging the capacitor element 40 in this manner can effectively reduce a leakage of unwanted waves of distortion modes from the SMR filter toward the antenna connecting terminal 100.

In the multiplexer 10, the band included in the pass band of the SMR filter, which is one of the filters 11 and 12, may be n41, n77, n78, or n79 for 5G-NR.

With this configuration, in the SMR, a heat dissipation path via the Si substrate 116 is formed because of the presence of the acoustic multilayer film. The SMR thus exhibits higher heat dissipation characteristics than the FBAR. The multiplexer 10 can thus support the high power mode with improved heat dissipation characteristics.

The radio-frequency module 1A according to an embodiment includes the multiplexer 10A, the module laminate 60, and the power amplifiers 21 and 22. The multiplexer 10A is mounted on the module laminate 60. The output terminal of the power amplifier 21 is connected to the input terminal of the filter 13A. The power amplifier 21 is mounted on the module laminate 60. The output terminal of the power amplifier 22 is connected to the input terminal of the filter 13B. The power amplifier 22 is mounted on the module laminate 60. Each resonator of one of the filters 13A and 13B is an FBAR, while each resonator of the other one of the filters 13A and 13B is an SMR. The distance of the other one of the filters 13A and 13B whose resonators are SMRs to the power amplifier connected to the input terminal of one of the filters 13A and 13B whose resonators are FBARs may be smaller than the distance of one of the filters 13A and 13B whose resonators are FBARs to this power amplifier.

With this configuration, it is possible to regulate a temperature rise of the FBAR filter responding to a temperature rise of the radio-frequency module 1A caused by heat generated in the power amplifier to a smaller level. The radio-frequency module 1A is thus able to achieve signal transmission with a smaller loss.

The communication apparatus 5 includes the antenna 2, the RFIC 3 that processes a radio-frequency signal to be sent by the antenna 2 and a radio-frequency signal received by the antenna 2, and the multiplexer 10 or the radio-frequency module 1 that transmits the radio-frequency signals between the antenna 2 and the RFIC 3.

The communication apparatus 5 is thus able to reduce unwanted waves of multiple major distortion modes.

Other Embodiments

The multiplexers, radio-frequency modules, and communication apparatuses have been discussed above through illustration of the above-described embodiments and modified examples. However, the invention is not restricted to the above-described embodiments and modified examples. Other embodiments implemented by combining certain components in the above-described embodiments and modified examples and modified examples obtained by making various modifications to the above-described embodiments and modified examples by those skilled in the art without departing from the scope and spirit of the invention are also encompassed in the invention. Various types of equipment integrating any of the above-described multiplexers, radio-frequency modules, and communication apparatuses are also encompassed in the invention.

For example, in the circuit configurations of the multiplexers, radio-frequency modules, and communication apparatuses according to the above-described embodiments and modified examples, a matching element, such as an inductor and a capacitor, and a switch circuit may be connected between circuit elements. In this case, a wiring inductor constituted by wiring for connecting the circuit elements may be used as the inductor.

The present disclosure can be widely used for communication equipment, such as a mobile phone, as a multiplexer, a radio-frequency module, and a communication apparatus that can be applied to a multiband system including bands for LTE, 5G-NR, and WLAN.

What is claimed is:

1. A multiplexer comprising:
a first filter connected to a common terminal and having a first pass band including a first band which is sized to pass a signal; and
a second filter connected to the common terminal and having a second pass band including a second band which is sized to pass another signal,
wherein the first filter includes
a first series arm resonator disposed on a first series arm path which connects the common terminal and a first radio-frequency input terminal that receives a first sending signal of the first band, and
a first parallel arm resonator disposed on a first parallel arm path which connects the first series arm path and a ground,
wherein each of the first series arm resonator and the first parallel arm resonator includes
a first support substrate,
a first bottom electrode disposed above the first support substrate,
a first top electrode disposed above the first bottom electrode, and
a first piezoelectric layer disposed between the first bottom electrode and the first top electrode,
wherein at least one of resonators forming the first series arm resonator and the first parallel arm resonator is constituted by a plurality of series-divided resonators connected in series with each other,
wherein the second filter includes
a plurality of second series arm resonators disposed on a second series arm path which connects the common terminal and a second radio-frequency input terminal that receives a second sending signal of the second band, and
a second parallel arm resonator disposed on a second parallel arm path which connects the second series arm path and a ground,
wherein each of the plurality of second series arm resonators and the second parallel arm resonator includes
a second support substrate,
a second bottom electrode disposed above the second support substrate,
a second top electrode disposed above the second bottom electrode, and
a second piezoelectric layer disposed between the second bottom electrode and the second top electrode, and
wherein, two adjacent second series arm resonators of the plurality of second series arm resonators, the second top electrode or the second bottom electrode of one second series arm resonator and the second top electrode or the second bottom electrode of the other second series arm resonator are formed by one electrode.

2. A multiplexer comprising:

a first filter connected to a common terminal and having a first pass band including a first band sized to pass a signal; and a second filter connected to the common terminal and having a second pass band including a second band which is sized to pass another signal, wherein the first filter includes a first series arm resonator disposed on a first series arm path which connects the common terminal and a first radio-frequency input terminal that receives a first sending signal of the first band, and a first parallel arm resonator disposed on a first parallel arm path which connects the first series arm path and a ground, wherein each of the first series arm resonator and the first parallel arm resonator includes a first support substrate, a first bottom electrode disposed above the first support substrate, a first top electrode disposed above the first bottom electrode, and a first piezoelectric layer disposed between the first bottom electrode and the first top electrode, wherein at least one of resonators forming the first series arm resonator and the first parallel arm resonator is constituted by a plurality of series-divided resonators connected in series with each other, wherein the second filter includes a second series arm resonator disposed on a second series arm path which connects the common terminal and a second radio-frequency input terminal that receives a second sending signal of the second band, and a plurality of second parallel arm resonators disposed on individual second parallel arm paths, each of the second parallel arm paths connecting the second series arm path and a ground, wherein each of the second series arm resonator and the plurality of second parallel arm resonators includes a second support substrate, a second bottom electrode disposed above the second support substrate, a second top electrode disposed above the second bottom electrode, and a second piezoelectric layer disposed between the second bottom electrode and the second top electrode, and wherein, two second parallel arm resonators of the plurality of second parallel arm resonators, one second parallel arm resonator being directly connected to one end of the second series arm resonator, the other second parallel arm resonator being directly connected to the other end of the second series arm resonator, the second top electrodes or the second bottom electrodes of the two second parallel arm resonators are formed by one electrode.

3. The multiplexer according to claim 1, further comprising:

a third filter connected to the common terminal and having a third pass band sized to pass a signal in a third band, wherein a frequency of a predetermined wave of a second- or fourth-order distortion mode, which is generated when the first sending signal and the second sending signal are simultaneously transmitted, is included in at least one of the first pass band, the second pass band, and the third pass band, and a frequency of a predetermined wave of a third-order distortion mode, which is generated when the first sending signal and the second sending signal are simultaneously transmitted, is included in at least one of the first pass band, the second pass band, and the third pass band.

4. The multiplexer according to claim 3, wherein:

the first band is n46 for 5G-NR;

the second band is n77 or n78 for 5G-NR; and the third band is Band 3 for LTE.

5. The multiplexer according to claim 3, wherein:

the first band is n46 for 5G-NR;

the second band is n77 for 5G-NR; and the third band is Band 2 for LTE.

6. The multiplexer according to claim 3, wherein:

the first band is n77 for 5G-NR;

the second band is n41 for 5G-NR; and the third band is n46 for 5G-NR.

7. The multiplexer according to claim 3, wherein:

the first band is n41 for 5G-NR;

the second band is n40 for 5G-NR; and the third band is n79 for 5G-NR.

8. The multiplexer according to claim 3, wherein:

the first band is n79 for 5G-NR;

the second band is n77 or n78 for 5G-NR; and the third band is n40 for 5G-NR or a wireless local area network (WLAN).

9. The multiplexer according to claim 1, wherein the plurality of series-divided resonators are connected to the common terminal at positions closer to the common terminal than other resonators forming the first series arm resonator and the first parallel arm resonator.

10. The multiplexer according to claim 1, wherein the two adjacent second series arm resonators are connected to the common terminal at positions closer to the common terminal than other resonators forming the plurality of second series arm resonators.

11. The multiplexer according to claim 2, wherein the two second parallel arm resonators are connected to the common terminal at positions closer to the common terminal than other resonators forming the plurality of second parallel arm resonators.

12. The multiplexer according to claim 1, wherein a relative dielectric constant of the first piezoelectric layer is lower than a relative dielectric constant of the second piezoelectric layer.

13. The multiplexer according to claim 1, wherein:

each of the resonators forming one of the first and second filters is an FBAR (Film Bulk Acoustic Resonator);

each of the resonators forming the other one of the first and second filters is an SMR (Solidly Mounted Resonator); and a pass band of one of the first filter and the second filter whose resonators are FBARs is positioned at a lower frequency side than a pass band of the other one of the first filter and the second filter whose resonators are SMRs.

14. The multiplexer according to claim 13, wherein the other one of the first and second filters further includes a capacitor element, the capacitor element being connected between the common terminal and a resonator which forms the first filter and which is connected to the common terminal at a position closer to the common terminal than other resonators forming the first series arm resonator and the first parallel arm resonator or being connected between the common terminal and a resonator which forms the second filter and which is connected to the common terminal at a position closer to the common terminal than other resonators forming the plurality of second series arm reso-
nators and the second parallel arm resonator.

15. The multiplexer according to claim 13, wherein a band
included in the first pass band or the second pass band of the
other one of the first and second filters is n41, n77, n78, or
n79 for 5G-NR.

16. A radio-frequency module comprising:

the multiplexer according to claim 1;

a module laminate, the multiplexer being disposed on the
module laminate;

a first power amplifier disposed on the module laminate,
an output terminal of the first power amplifier being
connected to an input terminal of the first filter; and a second power amplifier disposed on the module lami-
nate, an output terminal of the second power amplifier
being connected to an input terminal of the second
filter, wherein each resonator forming one of the first and
second filters is an FBAR, wherein each resonator forming the other one of the first
and second filters is an SMR, and wherein a distance of the other one of the first and second
filters whose resonators are SMRs to one of the first and
second power amplifiers which is connected to the
input terminal of one of the first and second filters whose resonators are FBARs is smaller than a distance
of one of the first and second filters whose resonators
are FBARs to one of the first and second power
amplifiers which is connected to the input terminal of
one of the first and second filters whose resonators are
FBARs.

17. A communication apparatus comprising:

an antenna;

a radio-frequency signal processing circuit that processes
a radio-frequency signal to be sent by the antenna and
a radio-frequency signal received by the antenna; and the multiplexer according to claim 1 that is configured to
transmit the radio-frequency signals between the
antenna and the radio-frequency signal processing cir-
cuit.

18. A communication apparatus comprising:

an antenna;

a radio-frequency signal processing circuit that processes
a radio-frequency signal to be sent by the antenna and
a radio-frequency signal received by the antenna; and the radio-frequency module according to claim 16 that
transmits the radio-frequency signals between the
antenna and the radio-frequency signal processing cir-
cuit.

* * * * *